United States Patent [19]

Garde

[11] 4,378,530
[45] Mar. 29, 1983

[54] HIGH-EFFICIENCY LOW-DISTORTION AMPLIFIER

[75] Inventor: Peter Garde, Sydney, Australia

[73] Assignee: Unisearch Limited, Kensington, Australia

[21] Appl. No.: 162,751

[22] Filed: Jun. 25, 1980

[30] Foreign Application Priority Data

Jul. 4, 1979 [AU] Australia .................................. PD9443

[51] Int. Cl.³ .............................................. H03F 3/04
[52] U.S. Cl. ..................................... 330/297; 330/267
[58] Field of Search ................. 330/96, 267, 268, 297, 330/202

[56] References Cited

U.S. PATENT DOCUMENTS 3,426,290 2/1969 Jensen .................................. 330/297
4,218,660 8/1980 Carver ................................. 330/297

FOREIGN PATENT DOCUMENTS 2137249 2/1973 Fed. Rep. of Germany ...... 330/297

Primary Examiner—James B. Mullins
Assistant Examiner—Gene Wan
Attorney, Agent, or Firm—Brumbaugh, Graves, Donohue & Raymond

[57] ABSTRACT

An amplifier system comprising at least two tracking switching regulators or a dual-output regulator, which regulators vary the voltage across the output stage at the signal or its envelope rate.

10 Claims, 9 Drawing Figures

HIGH-EFFICIENCY LOW-DISTORTION AMPLIFIER

TECHNICAL FIELD

The present invention relates to amplifiers and inverters, including their power supplies, and in particular to audio power amplifiers. The invention is specifically concerned with the provision of high-efficiency, low-distortion amplifier-power-supply-combinations and wherein the additional attributes of low cost, small size, low weight and improved reliability of operation may, if desired, be attained simultaneously.

BACKGROUND OF THE INVENTION

In prior amplifier technology, it has been difficult to design a high-efficiency amplifier which also exhibits low distortion. In the present specification, an amplifier is taken to include its associated power supply, and a low-distortion amplifier is defined as one whose signal transfer function closely approximates the desired or required transfer function. The desired transfer function for an audio amplifier is linear at all audio frequencies, while in a control system, for example, the desired transfer function may be nonlinear. Both types of transfer function can be realized with high accuracy, here referred to as low distortion, by the implementation of the present invention. High efficiency is a desirable attribute because not only is less power required by the amplifier for a given output, but heat-sink requirements to eliminate the wasted power from the amplifier are reduced. In addition, output devices with a reduced power rating may be employed in the amplifier, or, if there are several output devices, fewer may be needed for a given amplifier power rating. Reducing the heat-sink requirements, reducing the necessary output-device ratings, and reducing the number of output devices, all lower the final cost of an amplifier and decrease its size and weight. The cost, size and weight may be further reduced by the elimination of any mains- or audio-frequency transformers carrying substantial power; although, if the mains-frequency transformer is omitted, for many applications the design must still provide mains isolation. An efficient amplifier may also be designed to run at lower temperatures, and as the output devices then suffer less stress, reliability of operation is increased.

Low distortion is also an important attribute for amplifiers. While high-efficiency amplifiers utilizing switching techniques, commonly referred to as Class-D amplifiers, have been known for some time (see, for example: H. R. Camenzind, "Modulated pulse audio power amplifiers for integrated circuits", IEEE Trans. Audio Electroacoust., vol. AU-14, pp. 136-140, Sept. 1966; J. A. Dutra, "Digital amplifiers for analog power", IEEE Trans. Consumer Elec., vol. CE-24, pp. 308-316, Aug. 1978), they have failed to become popular because their distortion is high; low distortion is an essential requirement for high-fidelity audio amplifiers. Another problem with Class-D amplifiers which has limited their acceptance is radiation of high-frequency interference or noise from the amplifier output.

Jensen and Kibakin (references: J. L. Jensen, "Amplifier having series regulated voltage supply", U.S. Pat. No. 3,426,290, Feb. 4, 1969; V. M. Kibakin, "An amplifier with a tracking power supply", Telecommun. Radio Eng., pt. 2, vol. 30, pp. 127-128, Mar. 1975) have described high-efficiency amplifiers which have no switching signals at their output and therefore do not radiate high frequency interference. However, these amplifiers have several defects. They do not exhibit low distortion, their output-stage circuitry is not isolated from the power-supply source, they require audio-frequency transformers one of which carries the total amplifier output and which may need mains-quality insulation, and they do not have high efficiency if the output devices are biased with appreciable current (for Class-A biasing the quiescent current is half the maximum peak current).

SUMMARY OF THE INVENTION

It is an object of the present invention to ameliorate the defects of the Class-D amplifier and also those of the amplifiers of Jensen and Kibakin.

The amplifier of the present invention is designed so that audio transformers are not required. In this way cost, size and weight benefits accrue and the amount of negative feedback that can be applied around the output stage, normally limited by phase shift in the audio transformers, is increased. The high level of feedback around the output stage is a reason why the amplifier exhibits low distortion.

The amount of negative feedback can also be increased above that due to the overall loop around the amplifier by enclosing the output stage in local feedback loops.

The amplifier of the present invention has high efficiency because the voltage across any output device carrying significant current is kept low by tracking switching regulators. The outputs of the regulators track the signal levels on the output devices. Two switching regulators or one dual-output switching regulator are employed, in contrast to the single-regulator arrangement of Jensen and Kibakin. This essential feature of the present invention avoids the necessity for an audio-frequency output transformer as required by the amplifiers of Jensen and Kibakin. The tracking switching regulators of embodiments of the present invention may possess power-supply-source isolation due to the inclusion of a transformer. However, this transformer is driven with high-frequency signals above the audio spectrum so that its size is small and its weight light. The amplifier can be designed for either an ac or a dc power-supply source.

The large amount of negative feedback which it is possible to apply around the output stage is an important advantage because it isolates the amplifier output from the tracking switching regulator outputs, thereby maintaining low distortion. The isolation may be further increased by interposing tracking linear regulators between the tracking-switching-regulator outputs and the amplifier output stage.

BRIEF DESCRIPTION OF THE DRAWINGS

The present invention will now be described more fully with reference to preferred embodiments as shown in the accompanying drawings, and in which.

DETAILED DESCRIPTION OF THE PREFERRED EMBODIMENTS

Figure 1:
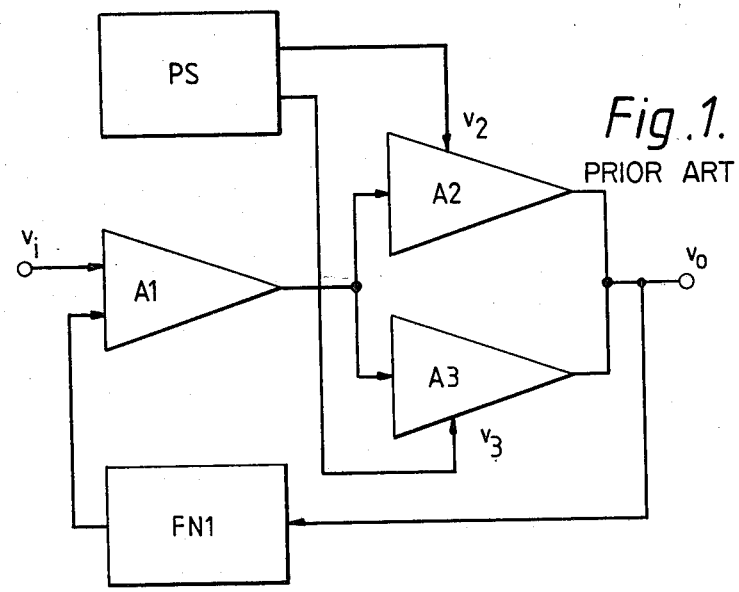
FIG. 1 is block diagram of a prior-art feedback amplifier.

In order to appreciate the operation of an amplifier of the present invention it is worthwhile considering the prior-art amplifier shown in FIG. 1.

An input signal $v_i$, together with a signal from a feedback network FN1, is amplified by a low-power amplifier stage A1 and then passes to high-power amplifier stages A2 and A3. (A signal variable is indicated by the use of a lower-case letter.) The stages A2 and A3 may represent a push-pull output configuration. The outputs of A2 and A3 are added together to form the output signal $v_o$. The feedback network FN1 around the amplifier stages defines the closed-loop transfer function $v_o/v_i$ of the amplifier. The high power stages A2 and A3 are supplied with power from a conventional power supply PS; the output voltages $V_2$ and $V_3$ of PS are approximately constant. (A constant is indicated by the use of an upper-case letter.)

There are various classes of operation of stages A2 and A3. The three common modes of operation are designated Class A, Class B and Class AB. In Class-A operation, the stages A2 and A3 are never completely cutoff. This has the advantage of low distortion but also the disadvantage of requiring substantial quiescent power; hence Class-A operation gives low power efficiency. In Class-B operation, A2 amplifies the signal for only half the signal swing and then becomes cutoff. Stage A3, which was cutoff when A2 was on, amplifies the signal for the other half of the signal swing. The advantage of this mode of operation is that no quiescent power is necessary and so power efficiency is improved. The disadvantage is that appreciable distortion (cross-over distortion) occurs in practice when the signal is switched between A2 and A3, each half cycle. Class AB is a compromise between Class A and Class B. In Class-AB operation, A2 and A3 are both on for small signals and the system acts in Class-A mode. Only when the signal level is high are A2 and A3 alternately on and cutoff. In this way crossover distortion is minimized, quiescent power is low, and power efficiency is made more acceptable than for Class-A operation.

With a prior-art amplifier, all of these classes of operation exhibit an efficiency considerably less than 100%. For example, with a sinusoidal signal, ideal Class-A operation has a maximum efficiency of 50% and ideal Class-B operation has a maximum efficiency of 78%. These efficiencies are attained only under full drive under idealized conditions; in real operation with typical program material, the efficiency of an amplifier including its power supply is very low, often only a few percent.

The power dissipated by the prior-art amplifier is high. For example, the maximum instantaneous (peak) power dissipation is ideally twice the maximum output power for a Class-A design and half the maximum output power for a Class-B design. The maximum average power dissipation is ideally twice the maximum output power for a Class-A design and 0.4 times the maximum output power for a Class-B design assuming sinusoidal drive.

The problem of the low efficiency of the prior-art amplifier arises because the power-supply voltages, $V_2$ and $V_3$ in FIG. 1, are fixed. The design dilemma is that if at one instant $v_o$ is small, only low values of $V_2$ and $V_3$ are strictly required; however, $V_2$ and $V_3$ must be made high because $v_o$ may subsequently become large. Even when the amplifier output waveform is of large amplitude, high values of $V_2$ and $V_3$ are not strictly required for a whole cycle of the waveform. For most signals $V_2$ and $V_3$ are excessive considering the instantaneous amplitude of the output signal, and the voltage across the circuitry of A2 and A3 is larger than required. As a result, power dissipation in the circuitry is substantial and amplifier efficiency is poor.

If instead of the supply voltages of the power stages being fixed, they are varied in accordance with the minimum actually required by the amplifier, considering the signal being amplified, then a high-efficiency amplifier is obtained. This procedure may be implemented for the amplifier of FIG. 1, by making the outputs $V_2$ and $V_3$ of the power supply PS vary dependent upon the amplifier output $v_o$. A power supply whose output may be constrained to follow a given signal is called a tracking regulator. Unfortunately, if a linear tracking regulator is used with the amplifier of FIG. 1, the efficiency of the overall system is not improved because the power formerly dissipated in A2 and A3 is now dissipated by the tracking linear regulator. To improve overall efficiency a high efficiency tracking regulator is required. Such a regulator can be built if switching, rather than linear, techniques are employed. A regulator of this type is called a tracking switching regulator (TSR). It is difficult to make a TSR follow its input control signal with high accuracy, however, this characteristic is of little importance because the amplifier stages A2 and A3 correct for any distortion in $v_2$ and $v_3$.

The first embodiment of the present invention will now be described with reference to FIG. 2. In this figure A1, A2, A3 and FN1 are as for FIG. 1, however, the power for A2 and A3 is supplied by tracking switching regulators. The tracking switching regulators may be divided into two parts, referred to in the present specification as switching-regulator controllers SRC1 and SRC2 and the switching regulators SR1 and SR2. The input signal of the controllers is the amplifier output $v_o$. In a typical realization the controllers might maintain $v_2$ and $v_3$ within 5 to 10 volts of $v_o$. It is readily apparent that there is a large increase in efficiency over the prior-art amplifier whose power supply has a fixed output voltage of say $\pm 40$ to $\pm 100$ volts.

Figure 2:
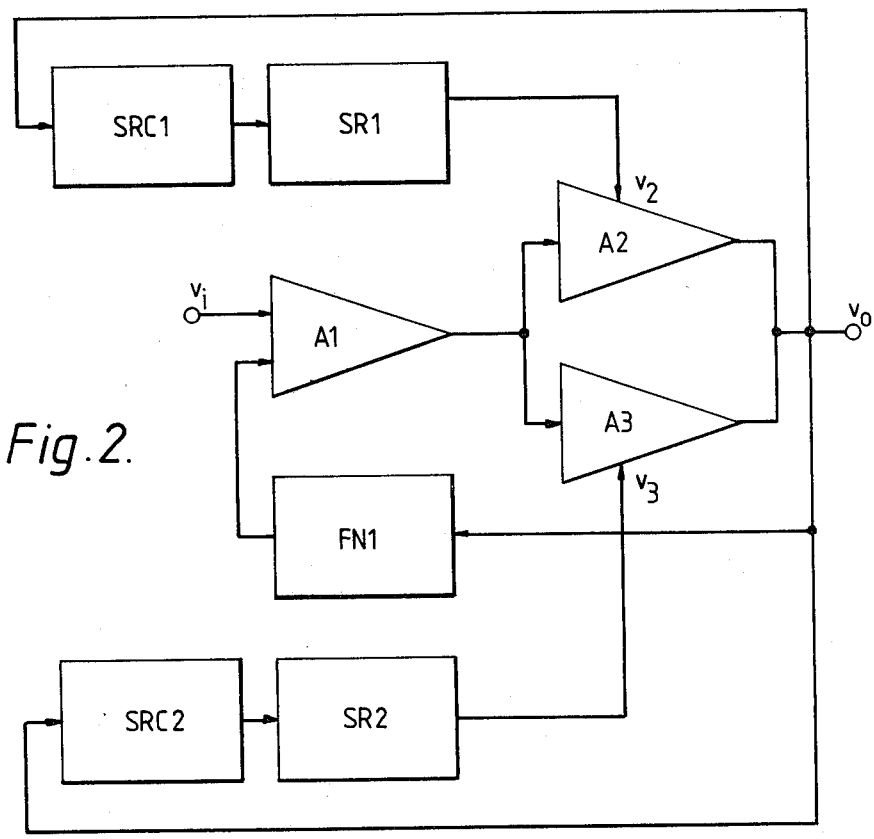
FIG. 2 is a block diagram of a first embodiment of the invention.

A further advantage of the configuration of FIG. 2 is that if $v_2$ and $v_3$ are maintained close to $v_o$, then the voltage ratings of the devices in A2 and A3 are much reduced, compared with the prior-art amplifier.

The first embodiment is suitable for amplifiers working in Class-A, Class-B or Class-AB mode. A particular advantage of the first embodiment is that efficiency is higher than for the amplifiers of Jensen and Kibakin for Class-A and Class-AB biasing because the voltage across all output devices is always low. (The voltage across all output devices of the amplifiers of Jensen and Kibakin cannot be maintained low under signal conditions.)

Figure 3:
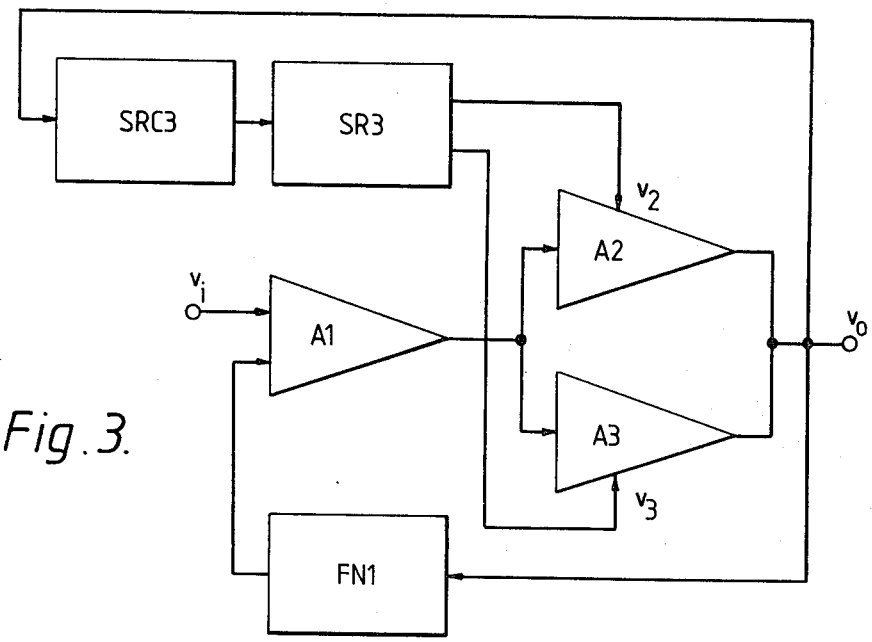
FIG. 3 is a block diagram of a second embodiment of the invention.

The second embodiment of the invention is shown in FIG. 3. In this arrangement the two tracking switching regulators of the first embodiment are replaced by one dual-output tracking switching regulator. This regulator is composed of a switching-regulator controller SRC3 and a switching regulator SR3. The second embodiment is otherwise similar to the first. The main advantage of the second embodiment is that it may be less expensive to implement.

To achieve high efficiency the magnitudes of the output voltages from the dual-output tracking switching regulator are kept as low as possible consistent with the amplifier being able to supply the output voltage $v_o$. However, the second embodiment usually has an additional design constraint, namely, that the magnitude of $v_2$ is greater than the magnitude of $v_3$ when the current in A3 is greater than that in A2, and conversely, the magnitude of $v_3$ is greater than the magnitude of $v_2$ when the current in A2 is greater than that in A3 (in the first embodiment $v_2$ and $v_3$ may be independent). Therefore, the efficiency of the second embodiment compared with the first, reduces as the quiescent current of A2 and A3 is increased, although it is always higher than for the prior-art amplifier of FIG. 1.

The tracking switching regulators of both the first and second embodiments derive their output from an ac or dc power-supply source via small transformers operating at high frequency. The cost, size and weight advantages of this arrangement have already been noted.

Figure 4:
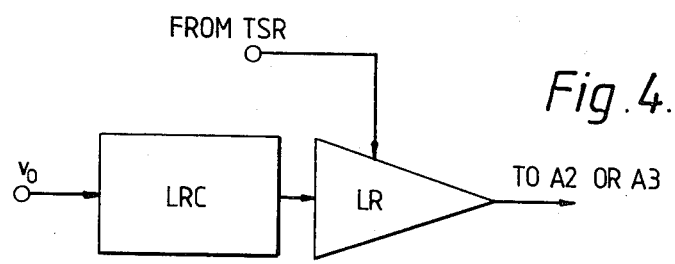
FIG. 4 is a block diagram of a distortion-reducing modification which may be added to FIG. 2 or FIG. 3.

The distortion of the amplifier embodiments of the present invention may be further reduced if the distortion of $v_2$ and $v_3$ is lowered. This may be implemented by following the tracking switching regulators with tracking linear regulators. The arrangement is shown in FIG. 4. A linear regulator LR regulates the output of a TSR and then passes it to A2 or A3. The regulator is controlled by the linear-regulator controller LRC from $v_o$ or another suitable voltage. A disadvantage of this arrangement is that the system efficiency is reduced due to the voltage drop required across the tracking linear regulator for its operation; however, this may be made small.

Figure 5:
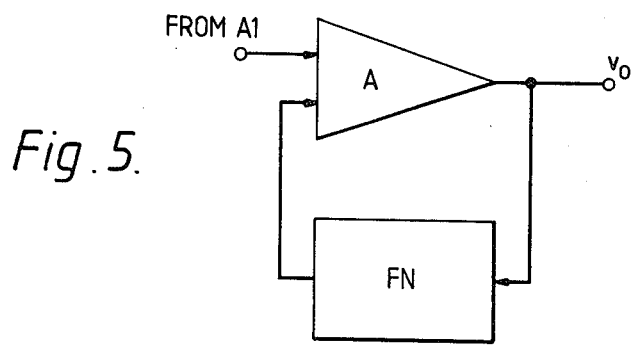
FIG. 5 is a block diagram of a further distortion-reducing modification which may also be added to FIG. 2 or FIG. 3.

Another technique for reducing the distortion of $v_2$ and $v_3$, which also reduces distortion generated by A2 and A3, is to place a local feedback loop around A2 and A3 taken together, and/or local feedback loops around A2 and A3 taken individually. The technique is shown in FIG. 5. An output stage A is enclosed by the feedback network FN.

Figure 6:
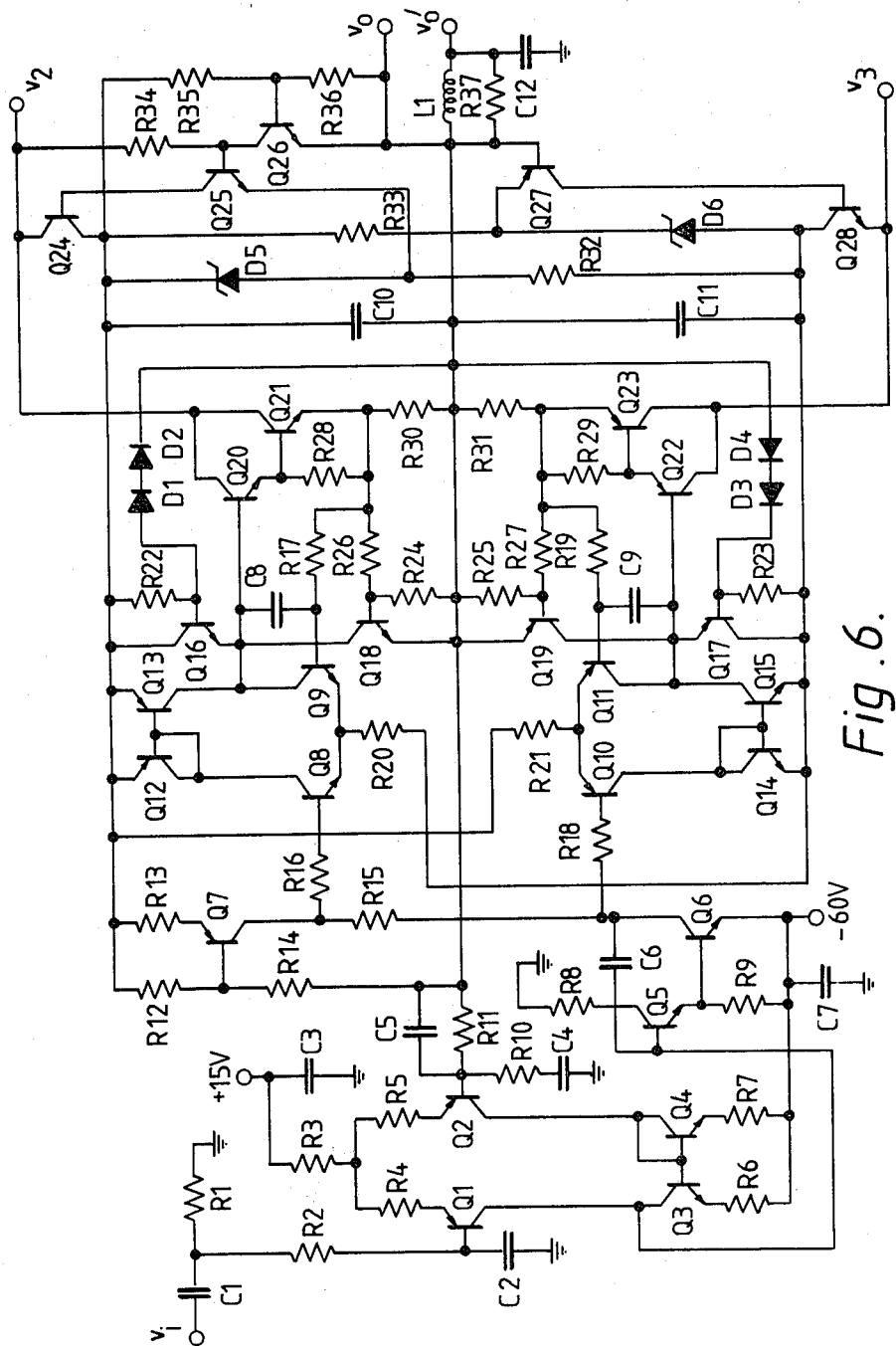
FIG. 6 is a circuit diagram of an amplifier (not including power supply) that may be used in the first or second embodiment of the invention.

The circuit diagram of an amplifier (not including power supply) that may be used in the first or second embodiment of the invention is shown in FIG. 6. The amplifier input signal $v_i$ is filtered by a bandpass filter comprised of C1, C2, R1 and R2. The input stage is a differential pair Q1 and Q2 with emitter degeneration provided by R4 and R5. The input stage is loaded by a current mirror Q3, Q4, R6 and R7.

The second stage is a common-emitter amplifier Q6 driven by an emitter follower Q5. The overall feedback loop is frequency compensated by C6. The second stage is loaded by the current-source transistor Q7.

The output stage is a true complementary push-pull configuration. The Darlington-connected emitter followers Q20 and Q21, Q22 and Q23 are driven from differential pairs Q8 and Q9, Q10 and Q12. The differential pairs are loaded by current mirrors Q12 and Q13, Q14 and Q15. There are two local feedback loops in the output stage. These are completed by R17 and R19 and frequency compensated by C8 and C9.

The output stage has two linear regulators comprised of D5, Q24 and Q25, D6, Q27 and Q28. The regulators set the quiescent conditions of the output stage. The regulators are started up by Q26. The bias current of the output transistors is controlled by the current from Q7 and by the components R15, R30 and R31. Crossover distortion is eliminated by the catching transistors Q16 and Q17. The output stage is protected by current-limiting transistors Q18 and Q19.

The amplifier load, which has a voltage $v_o'$, is decoupled from the amplifier at high frequencies by the low-pass filter C12, L1 and R37. The amplifier output voltage $v_o$ is the input signal of the switching-regulator controllers. The components C4, C5, R10 and R11 form the overall feedback network.

Figure 7:
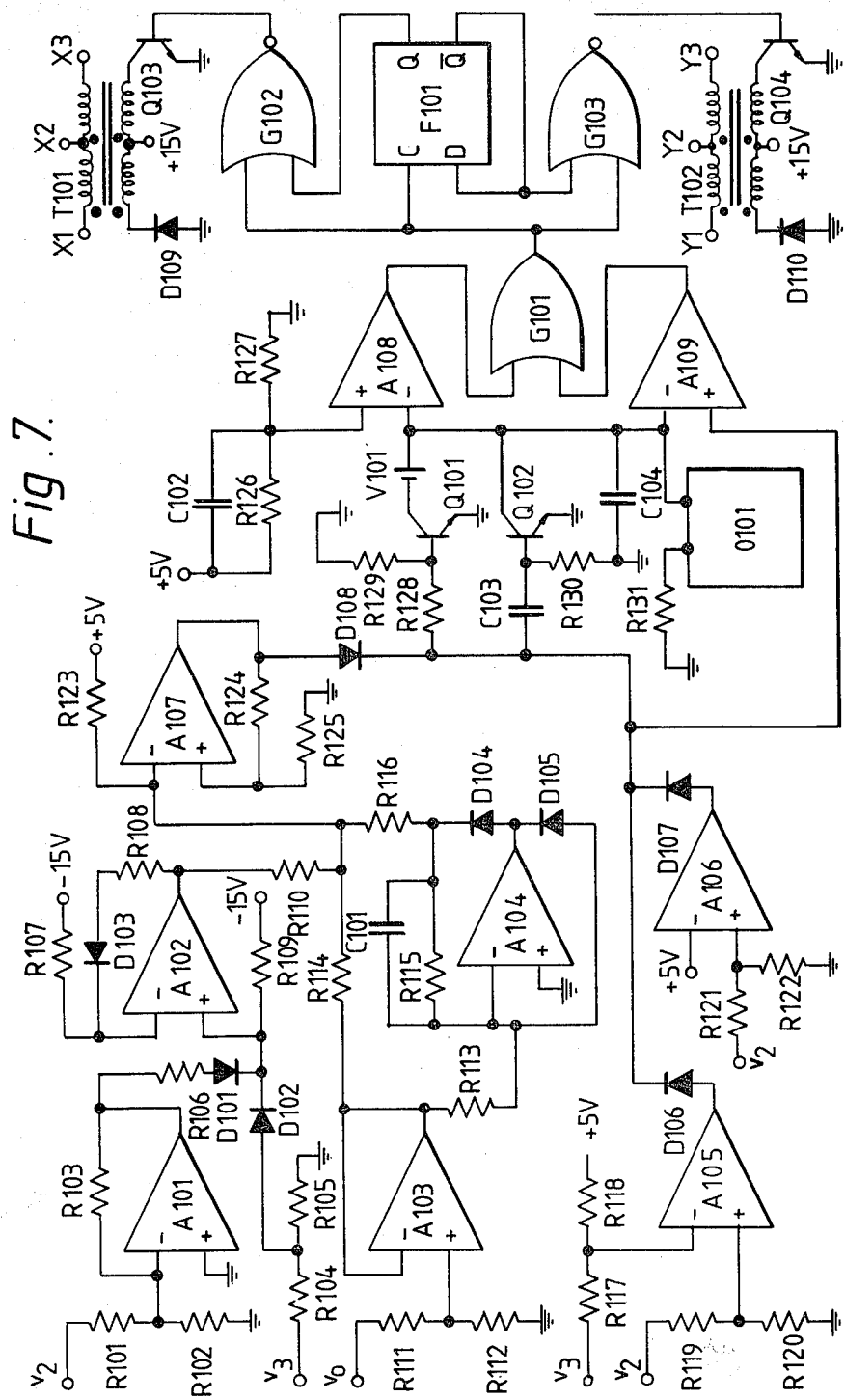
FIG. 7 is a partial schematic of a switching-regulator controller that may be used in the second embodiment of the invention.

A partial schematic of a switching-regulator controller that may be used in the second embodiment is shown in FIG. 7. Consider the node at the negative input of A107 and assume that it is at zero potential. The circuitry associated with A101 and A102 determines the lesser magnitude of the amplifier output-stage supply voltages $v_2$ and $v_3$ and injects a negative current proportional to this, via R110, into the node. The circuitry associated with A103 and A104 full-wave rectifies the amplifier output voltage $v_o$ and injects a positive current proportional to this, via R114 and R116, into the node. A constant current is also fed to the node, via R123. In reality, the node potential is not zero but oscillates, close to zero potential, its exact value determining whether or not the switching regulator output is to be increased. A low state at the output of A107 indicates that the regulator output is to be increased. A small amount of positive feedback around A107, via R124 and R125, avoids any spurious high-frequency oscillation.

Now consider a high state occurring at the output of comparator A107, indicating that the regulator output is to decrease. The high state is transferred via D108, A109 and G101 to G102 and G103 which turns Q103 and Q104, and hence the switching regulator, off as desired. When the positive input of A109 goes high, the charging current of C102 causes Q102 to completely discharge C104. (The floating voltage source V101 is small, or is otherwise arranged, such that no current flows in it, for this condition.) The capacitor C104, which controls the timing of the sawtooth oscillator O101, is then charged from the oscillator by a constant current set by R131. The capacitor voltage rises until it equals that of the floating voltage source V101 plus the saturation voltage of Q101. This total is set slightly above the voltage across R127. Thereafter the capacitor voltage is constant because the current from the oscillator flows via Q101 to earth. Neither Q103 or Q104 are on while the voltage across C104 is below the voltage across R127 because the output of A108 is high and the output of G101 must also be high. The time taken for C104 to charge to the voltage across R127 is called the dead time. The dead time is long when power is first applied to the controller because C102 must be charged up. This gives a desirable slow turn-on characteristic.

If the regulator output falls too low, the output of A107 becomes low. If, in addition, the voltage across R127 is less than that across C104, the low is transferred via A109 to the output of G101, and one of the transistors Q103 or Q104 turns on. Thus the regulator output is increased. The transistor Q101 is now off, so the voltage across C104 rises linearly. If the regulator voltage has not increased enough by the time the voltage across C104 equals that at the positive input of A109, the output of A109 changes state and the regulator is switched off for a compulsory dead time, after which the regulator voltage again rises. At any time, if the regulator output reaches the required output voltage, Q103 and Q104 are switched off. The flip-flop F101 steers the on signal from G101 to Q103 and Q104, alternately.

If the magnitude of the voltages $v_2$ or $v_3$ or their magnitude difference becomes too great, amplifier voltage ratings may be exceeded. Actually, there is no problem concerning the magnitude of $v_3$ for the amplifier of FIG. 6 because $v_3$ is limited by saturation of Q6. The magnitude of $v_2$ is limited by the controller of FIG. 7 by the circuitry associated with A106. The magnitude difference between $v_2$ and $v_3$ is limited by the circuitry associated with A105. A high state at the output of A105 or A106 turns the regulator off in the same manner as does a high at the output of A107.

In order to modify the response characteristics of the controller, it may be desirable to include lead- and/or lag-compensation networks in the signal paths prior to A107. These modifications, apparent to one skilled in the art, are not shown in FIG. 7.

Figure 8:
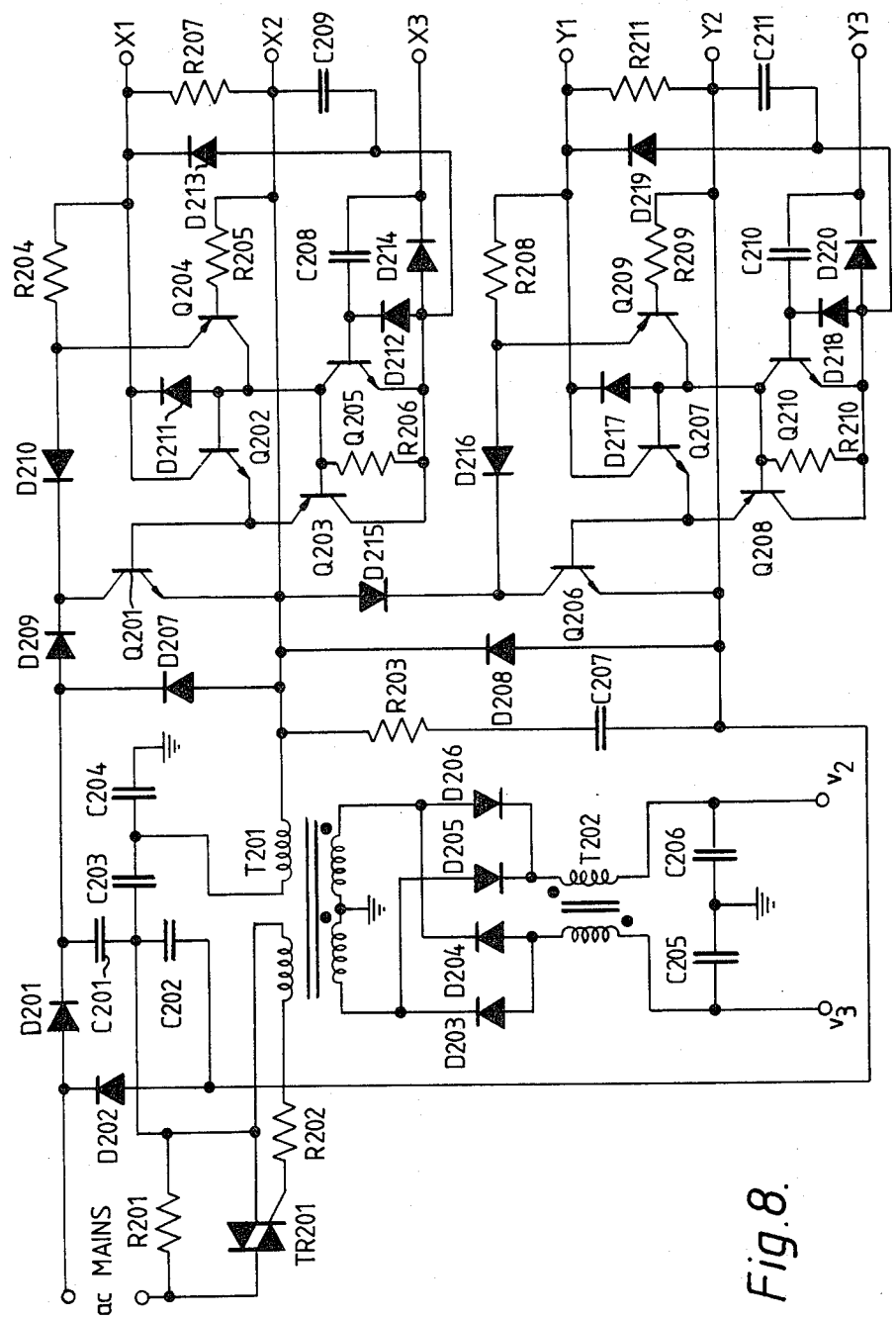
FIG. 8 is a circuit diagram of a switching regulator that may be used in the second embodiment of the invention.

A circuit diagram of a switching regulator that may be used in the second embodiment of the invention is shown in FIG. 8. In this circuit, bipolar transistors Q201 and Q206 are used as the power switching devices. These devices are driven via the transformers T101 and T102 of the switching-regulator controller in FIG. 7. The Q201 and Q206 base-drive circuits in FIG. 8, which are comprised of Q202, Q203, Q204 and Q205, Q207, Q208, Q209 and Q210, are designed to turn on and off quickly, drive the bases with the required current, avoid saturation in Q201 and Q206, discharge the bases at high current and maintain the bases at a suitable negative voltage when the devices are off. The diodes D209 and D215 prevent reverse voltages across Q201 and Q206. The diodes D207 and D208 are catching diodes that return energy to the supply when a power switching device turns off. The "snubber" network C207 and R203 protects Q201 and Q206 and improves the efficiency of the regulator. A dc supply is derived directly from the mains by C201, C202, D201 and D202. The triac TR201 and resistor R201 prevent large currents when the circuit is first switched on. The output of the high-frequency transformer T201 is rectified by D203, D204, D205 and D206 and smoothed by T202, C205 and C206. Transformer T202 is not an essential component, although it is useful in high-power designs. Additional current limiting, besides that inherent in the circuitry, may be desirable if T202 is employed.

Figure 9:
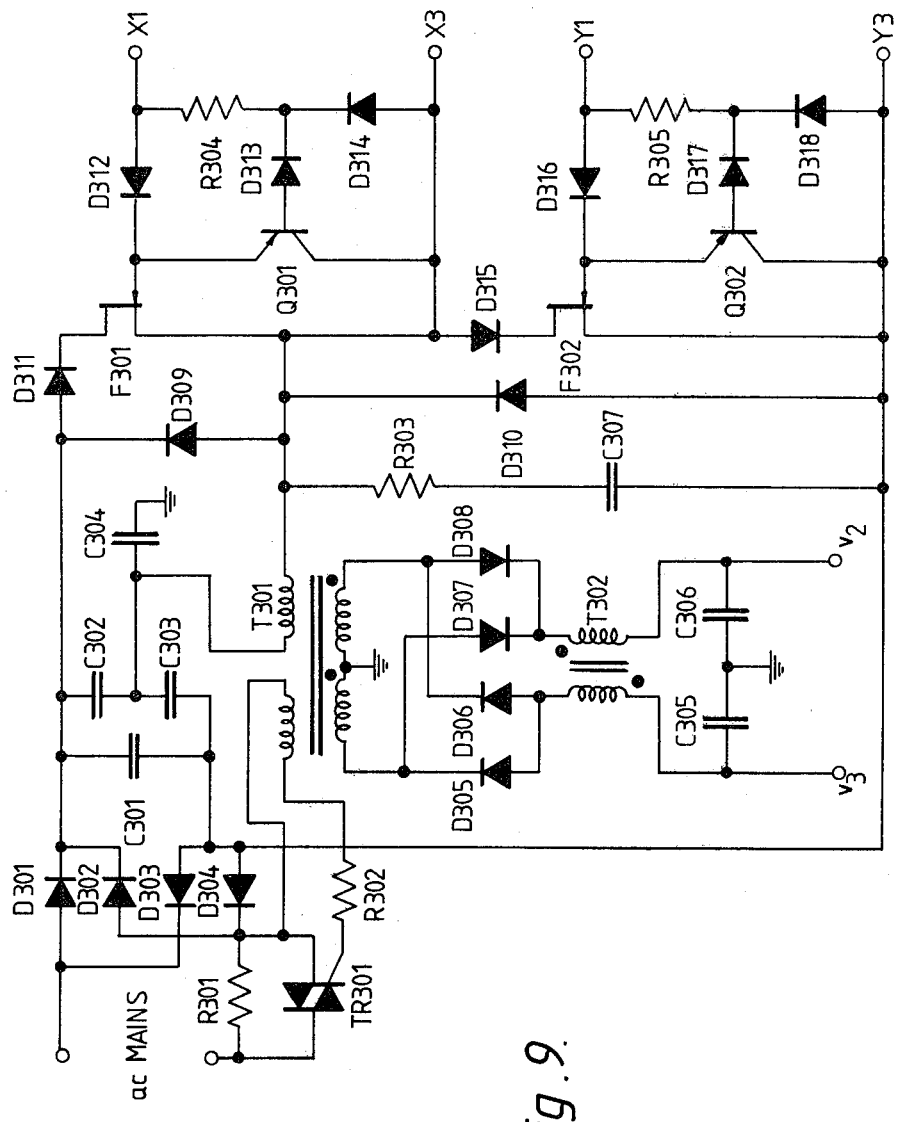
FIG. 9 is a circuit diagram of an alternative switching regulator that may be used in the second embodiment of the invention.

A circuit diagram of an alternative switching regulator that may be used in the second embodiment of the invention is shown in FIG. 9. In this version, MOS field-effect transistors F301 and F302 are used as the power switching devices. the general operation of the circuit is similar to the switching regulator of FIG. 8 just described. However, the gate-drive circuits in FIG. 9 which include Q301 and Q302 are simpler, and overall performance is improved due to the fast response of F301 and F302.

In the embodiments, $v_2$ and $v_3$ are controlled by the amplifier output signal $v_o$. With modifications apparent to one skilled in the art, the controllers can equally well employ as an input any other signal that is a function of $v_o$, for example, the amplifier input signal or the signal prior to a time or phase delay at the amplifier input.

In order to explain the principles of operation of the high-efficiency low-distortion amplifier embodiments, the stages with specialized functions have been separated and shown as different blocks in the figures. This division is somewhat arbitrary; if amplifier operation is explained from another point of view, division into different blocks might be more appropriate. For example, A2 and A3 could be grouped together, the SRC and SR could be grouped together, and the SRC and SR could be maintained to be part of the amplifier proper because they handle signals. While such distinctions may be made, the basic concepts that have been outlined are not affected by changes of this type.

The examples given in the present specification are illustrative only and are not intended to preempt the possible alternative methods of operation. In particular, any method for varying the supply rail voltages $v_2$ and $v_3$ dependent upon signal level, including both instantaneous level and envelope level, using switching-regulator techniques is envisiaged by the present specification if it improves system efficiency (that is, reduces the power dissipated in the amplifier for a given output).

The advantageous uses of the present invention are made by way of example. It will be appreciated by those skilled in the art that other uses are possible and that various adaptions and modifications can be made to the embodiments disclosed and other implementations can be employed.

I claim:

1. An amplifier system including a power supply and having a signal-input means for receiving an input signal, a power-input means for receiving power from an external source, and a signal-output means, and including means for achieving direct-current isolation between said power-input means and both said signal-input means and said signal-output means;

said signal-input means and said signal-output means being provided by an amplifier wherein the signal at the signal-output means varies in response to the signal at the signal-input means, the amplifier having at least two voltage-input means for receiving input energy for its operation and having a control-signal-output means;

said power-input means being provided by at least one tracking switching regulator having at least two voltage-output means for connection to said at least two voltage-input means, and a control-signal-output input means for connection to said control-signal-output means, and providing said direct-current-isolation means by virtue of a transformer operable at frequencies substantially higher than mainspower frequency, and wherein the signal at the voltage-output means varies in response to the instantaneous amplitude of the signal at the control-signal-input means such that the power dissipated by the amplifier is less than could be achieved with at least one tracking switching regulator having an output which only varies in response to the envelope of the signal being amplified.

2. An amplifier system as claimed in claim 1 wherein a tracking linear regulator is connected between said tracking-switching-regulator voltage-output means and said amplifier voltage-input means, said tracking linear regulator having a reference-signal-input means connected to said amplifier control-signal-output means such that the influence of signals at the tracking-switching-regulator voltage-output means upon the amplifier signal-output means is thereby reduced.

3. An amplifier system as claimed in claim 2 wherein at least one local feedback loop is connected around the amplifier output stage or parts thereof so as to reduce the influence of signals at said amplifier voltage-input means upon said amplifier signal-output means.

4. An amplifier system as claimed in claim 2 or 3 wherein each said tracking switching regulator is a single-stage regulator.

5. An amplifier system as claimed in claim 1, 2 or 3 wherein the signal at the amplifier signal-input means consists substantially of audio-frequency components.

6. An amplifier system including a power supply and having a signal-input means for receiving an input signal, a power-input means for receiving power from an external source, and a signal-output means for supplying power to a load connected across said signal-output means, and including means for achieving direct-current isolation between said power-input means and both said signal-input means and said signal-output means;

said signal-input means and said signal-output means being provided by an amplifier wherein the signal at the signal-output means varies in response to the signal at the signal-input means, the amplifier having at least two voltage-input means for receiving input energy for its operation and having a control-signal-output means;

said power-input means being provided by at least two tracking switching regulators having a voltage-output means for connection to said at least two voltage-input means, and a control-signal input means for connection to said control-signal-output means, said direct-current-isolation means being provided by a transformer operable at frequencies substantially higher than the frequency of said external source, and wherein the signal at the voltage-output means varies in response to the instantaneous amplitude of the signal at the control-signal-input means such that the power dissipated by the amplifier is less than could be achieved with tracking switching regulators having outputs which only vary in response to the envelope of the signal being amplified.

7. An amplifier system as claimed in claim 6 wherein a tracking linear regulator is connected between said tracking-switching-regulator voltage-output means and said amplifier voltage-input means, said tracking linear regulator having a reference-signal-input means connected to said amplifier control-signal-output means such that the influence of signals at the tracking-switching-regulator voltage-output means upon the amplifier signal-output means is thereby reduced.

8. An amplifier system as claimed in claim 7 wherein at least one local feedback loop is connected around the amplifier output stage or parts thereof so as to reduce the influence of signals at said amplifier voltage-input means upon said amplifier signal-output means.

9. An amplifier system as claimed in claim 6, 7 or 8 wherein each said tracking switching regulator is a single-stage regulator.

10. An amplifier system as claimed in claim 6, 7 or 8 wherein the signal at the amplifier signal-input means consists substantially of audio-frequency components.

* * * * *

UNITED STATES PATENT AND TRADEMARK OFFICE
CERTIFICATE OF CORRECTION

PATENT NO. : 4,378,530
DATED : March 29, 1983
INVENTOR(S) : Peter Garde

It is certified that error appears in the above—identified patent and that said Letters Patent is hereby corrected as shown below:

In claim 1, line 37, after "means" insert --for supplying power to a load connected across said signal-output means,--;

In claim 1, line 51, delete "output";

In claim 1, line 53, delete "and providing";

In claim 1, line 54, delete "by virtue of" and insert --being provided by--;

In claim 1, line 55, delete "mainspower" and insert --the--; and after "frequency" insert --of said external source--.

Signed and Sealed this

Nineteenth Day of July 1983

[SEAL]

Attest:

GERALD J. MOSSINGHOFF

Attesting Officer    Commissioner of Patents and Trademarks